(12) United States Patent
Shih

(10) Patent No.: US 9,318,422 B2
(45) Date of Patent: Apr. 19, 2016

(54) FLAT NO-LEAD PACKAGE AND THE MANUFACTURING METHOD THEREOF

(71) Applicant: ChipMOS Technologies Inc., Hsinchu (TW)

(72) Inventor: Chi-Jin Shih, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 14/619,257

(22) Filed: Feb. 11, 2015

(65) Prior Publication Data

US 2015/0303133 A1 Oct. 22, 2015

(30) Foreign Application Priority Data

Apr. 18, 2014 (TW) .............................. 103114138 A

(51) Int. Cl.
*H01L 23/495* (2006.01)
*H01L 23/28* (2006.01)
*H01L 23/00* (2006.01)
*H01L 21/56* (2006.01)

(52) U.S. Cl.
CPC .......... *H01L 23/49503* (2013.01); *H01L 21/56* (2013.01); *H01L 23/28* (2013.01); *H01L 23/49541* (2013.01); *H01L 23/49551* (2013.01); *H01L 24/83* (2013.01)

(58) Field of Classification Search
None
See application file for complete search history.

(56) References Cited

U.S. PATENT DOCUMENTS

| 7,087,462 | B1 * | 8/2006 | Park ...................... H01L 21/561 257/666 |
| 2011/0201159 | A1 * | 8/2011 | Mori ................... H01L 21/4832 438/123 |

* cited by examiner

*Primary Examiner* — Daniel Whalen
(74) *Attorney, Agent, or Firm* — Patterson & Sheridan, LLP

(57) ABSTRACT

A flat no-lead package includes an encapsulating material, and a die pad, a chip, a plurality of first contact pads and a plurality of second contact pads disposed in the encapsulating material. The encapsulating material has a package bottom surface. The die pad has a plurality of die pad extensions extending from the edges thereof. The chip is mounted on the die pad. The first contact pads are disposed near the edges of the encapsulating material and electrically coupled to the chip. The second contact pads are located between the die pad and the first contact pads and electrically coupled to the chip. Each of the second contact pads have a second contact pad extension corresponding to one of the die pad extensions respectively. The bottom surfaces of the first contact pads, the second contact pads and the second contact pad extensions are exposed on the package bottom surface.

20 Claims, 6 Drawing Sheets

FLAT NO-LEAD PACKAGE AND THE MANUFACTURING METHOD THEREOF

CROSS REFERENCES TO RELATED APPLICATION

This application claims priority to Taiwan Patent Document No. 103114138, filed on Apr. 18, 2014 with the Taiwan Patent Office, which is incorporated by reference in its entirety.

BACKGROUND OF THE INVENTION

1. Field of the Invention

The present invention relates to a flat no-lead package and the manufacturing method thereof, more particularly, to a flat no-lead package and the manufacturing method thereof which can increase the number of contact points.

2. Description of the Prior Art

Dual Flat No-lead packages (DFN) or Quad Flat no-lead packages (QFN) have the advantages of lower cost, smaller thickness, and applicability to be bonded on the PCB with the surface mount technology (SMT), so the DFNs or QFNs have been widely used in the packaging of semiconductor chips. However, since the contact pads of the DFN QFN are disposed around the outer rim of the package and the pitches between the contact pads have certain limitations restricted by the SMT capability, within a certain package footprint area, the number of contact pads cannot be increased efficiently. To other words, increasing the number of contact pads would increases the package footprint area, which restricts the application of DFNs/QFNs in high pin-count packages.

However, to meet the needs of lightness, thinness and compactness fin products, it is always an aim of development for the semiconductor packaging to achieve the maximum performance within a limited packaging space. Therefore, how to increase the number of contact pads without influencing the package footprint/volume become an important topic in the field of semiconductor packaging.

SUMMARY OF THE INVENTION

An aspect of the present invention is to provide is at no-lead package that can increase the number of contact pads without enlarging the package footprint area.

According to an embodiment of the present invention, the present invention provides a flat no-lead package comprising an encapsulating material, a die pad, a chip, a plurality of first contact pads and a plurality of second contact pads. The encapsulating material has a package bottom surface. The die pad is disposed in the encapsulating material and adjacent to the package bottom surface, wherein a plurality of die pad extensions extend from edges of the die pad, and a bottom surface of one end of each of the die pad extensions which is away from the die pad is exposed on the package bottom surface. A chip is disposed in the encapsulating material and mounted on the die pad. A plurality of first contact pads are disposed in the encapsulating material and near edges of the encapsulating material. The first contact pads are electrically coupled to the chip, wherein a bottom surface of the first contact pads is exposed on the package bottom surface. A plurality of second contact pads are disposed in the encapsulating material and located between the die pad and the first contact pads. The second contact pads are electrically coupled to the chip, wherein each of the second contact pads has a second contact pad extension corresponding to one of the die pad extensions respectively. The bottom surfaces of the second contact pads and the second contact pad extensions are exposed on the package bottom surface.

Another aspect of the present invention is to provide a manufacturing method a flat no-lead package that can increase the number of contact pads without altering the manufacturing process or adding manufacturing steps.

According to another embodiment of the present invention, the present invention provides a method for manufacturing a flat no-lead package comprising the following steps. A lead frame which comprises a die pad, a plurality of first contact pads and a plurality of second contact pads is first provided. The first contact pads are disposed around the die pad, and the second contact pads are disposed between the die pad and the first contact pads, wherein each of the second contact pads is connected to a side of the die pad through a first connection portion respectively. A chip is then mounted on the die pad. The chip is electrically coupled to the first contact pads and the second contact pads respectively. An encapsulating material is formed for covering the lead frame and the chip, wherein the encapsulating material exposes bottom surfaces of the first contact pads and the second contact pads. The first connection portions are partially removed for separating the second contact pads and the die pad such that the die pad has a plurality of die pad extensions and each of the second contact pads has a second contact pad extension corresponding to one of the die pad extensions respectively. The encapsulating material exposes a bottom surface of the second contact pad extensions.

With the flat no-lead package of the present invention, the number of the contact points disposed between the contact pads on the edge of the package and the die pad can be increased without enlarging the footprint area of the package. Moreover, by utilizing the method for manufacturing a flat no-lead package of the present invention, the number of contact points can be increased without alternating the manufacturing process or adding manufacturing steps.

BRIEF DESCRIPTION OF THE APPENDED DRAWINGS

FIG. 1A is a schematic diagram illustrating the bottom view of a flat no-lead package, according to an embodiment of the present invention, wherein FIG. 1 is the cross-section along line I-I of FIG. 1A.

The advantage, spirits, and features of the present invention will be apparent from the embodiments, the accompanying drawings and from the detailed description that follows. It is worth noting that, the accompanying drawings are schematic diagrams for easily understanding the present invention, the dimensions of the accompanying drawings are not illustrating in actual scale.

DETAILED DESCRIPTION OF THE INVENTION

The embodiments and the practical applications of the present invention will be described in the following paragraphs, so as to sufficiently explain the characteristics, spirits, and advantages of the invention.

Figure 1:
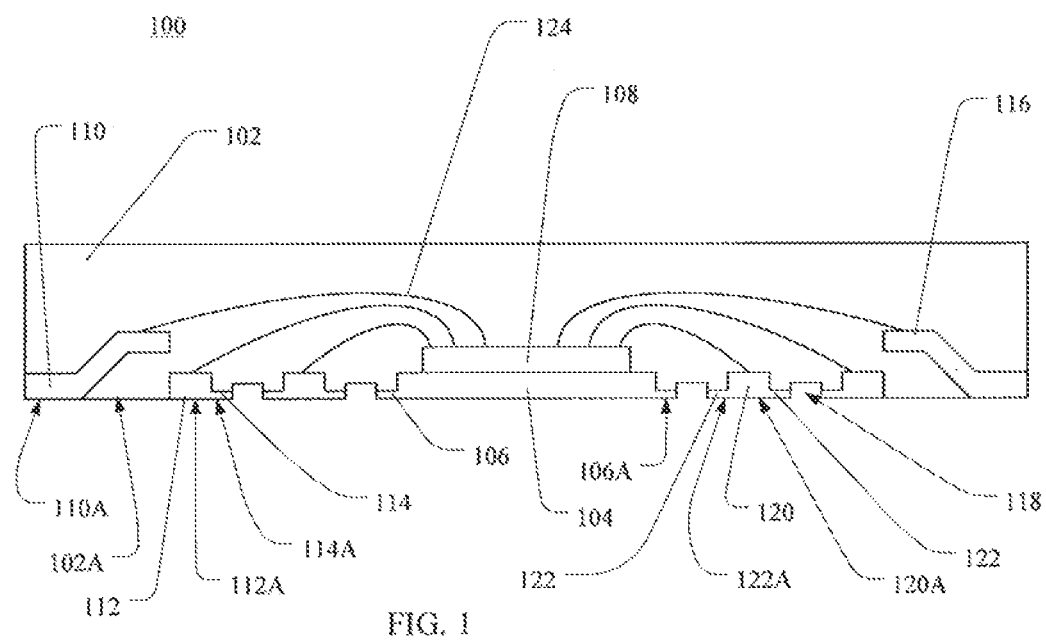
FIG. 1 is a schematic cross-sectional diagram of a flat no lead package, according to an embodiment of the present invention.

Please refer to FIG. 1, which is a schematic cross-sectional diagram of a flat no-lead package, according to an embodiment of the present invention. According to an embodiment of the present invention, the flat no-lead package 100 comprises an encapsulating material 102, such as epoxy or ceramic, etc. The flat no-lead package 100 has a package bottom surface 102A. A die pad 104 is disposed in the encapsulating material 102 and is adjacent to the package bottom surface 102A, preferably, exposed on the package bottom surface 102A so as to dissipate heat generated from a chip 108. The die pad 104 has a plurality of die pad extensions 106 extending from the edges of the die pad 104, and the bottom surface 106A of one end of each of the die pad extensions 106 which is away from the die pad 104 is exposed on the package bottom surface 102A. A chip 108 is disposed in the encapsulating material 102 and mounted on the die pad 104, where the chip 108 is attached on the die pad 104, for example, via a die attachment epoxy or a die attachment film not shown in FIG. 1). The adhesive materials can be electrically conductive to ground the chip, or thermally conductive for the chip 108 to dissipate heat via the die pad 104.

A plurality of first contact pads 110 are disposed in the encapsulating material 102 and near the edges of the encapsulating material 102, wherein the first contact pads 110 are electrically coupled to the chip 108, for example, via bonding wires 124. The bottom surface 110A of the first contact pads 110 is exposed on the package bottom surface 102A. In addition, a plurality of second contact pads 112 are disposed in the encapsulating material 102 and located between the die pad 104 and the first contact pads 110, and are electrically coupled to the chip 108, for example, via bonding wires 124. Each of the second contact pads 112 has a second contact pad extension 114 corresponding to one of the die pad extensions 106 respectively. That is to say, each of the second contact pads 112 is an extension from the die pad 104 through the die pad extension 106 and the second contact pad extension 114. The bottom surfaces 112A, 114A of the second contact pads 112 and the second contact pad extensions 114 are exposed on the package bottom surface 102A.

As mentioned in the statement above, in some embodiments of the present invention, the second contact pads 112 are extended from the die pad 104, and the connection portions between the second contact pads 112 and the die pad 104 are cut off by a step of partial removal (described in detail hereinafter), and thereby form the die pad extensions 106 and the second contact pad extensions 114. For the step of partial removal to be easily processed, the connection portions between the second contact pads 112 and the die pad 104 will first go through a half-etching process. The half-etching process makes the thicknesses of the die pad extensions 106 and the second contact pad extensions 114 relative to the package bottom surface 102A smaller than the thicknesses of the die pad 104 and the second contact pads 112 relative to the package bottom surface 102A, respectively, as shown in FIG. 1. The first contact pads 110 which are disposed on the edges of the encapsulating material 102 each has a first contact pad extensions 116 extending towards the die pad 104 and bending away from the package bottom surface 102A. As shown in FIG. 1, the first contact pad extensions 116 are bent upward, and the first contact pads 110 are electrically coupled to the chip 108 through the first contact pad extensions 116. It is worth noting that when doing the partial removal of the connection portions between the second contact pads 112 and the die pad 104, for example, by sawing method, the bend design of the first contact pad extensions 116 can prevent the first contact pad extensions 116 from being cut. Thus, it is not necessary to bend the end of every first contact pad extension 116, but only the first contact pad extensions 116 which lie on a cutting line are preferably to have their ends being bent. Additionally, besides bending, the first contact pad extensions 116 can also be formed by a half-etching process, that is, etching a predetermined depth of the first contact pad extensions 116 toward a direction away from the package bottom surface 102A.

In addition, the manner of the contact pads extending from the die pad is not limited to that mentioned above. Preferably, the contact pads extending from the die pad are arranged in staggered manner with each other. For the design of the lead frame, from the edges the die pad can extend multiple contact pad strings each with two or more than two of the contact pads connected in series. It is worth noting that, whether the connection portions between the contact pads connected in series or the connection portions between the contact pads and the die pad, one feature of the present invention is that in the manufacturing process of the lead frame, a half-etching process is preferably performed on the connection portions to etch toward the bottom of the package (the package bottom surface) so that the thicknesses of the connection portions between the die pad and the contact pads and between the contact pads are smaller than the thickness of the contact pads. The foregoing design would be advantageous to the partial removal step of the connection portions afterwards. It can avoid the depth of the partial removal from being too large, especially when sawing or punching method is used for the step of partial removal, and can prevent the bonding wires and other contact pads front being damaged, thus increasing the production yields. In some embodiments of the present invention, the distances between the die pad 104 and at least two of the second contact pads 112 adjacent to each other and each with the second contact pad extension 114 corresponding to one of the die pad extensions 106 respectively are different, that is, any two of the second contact pads 112 adjacent to each other and each with the second contact pad extension 114 corresponding to one of the die pad extensions 106 respectively are staggered with each other.

As mentioned above, in some embodiments of the present invention, the edges of the second contact pads 112, whether connected with the die pad 104 or connected to another contact pad, namely the second contact pad extensions 114, have at least a part with the thickness relative to the package bottom surface 102A smaller than the thickness of the second contact pads 112 relative to the package bottom surface 102A. Additionally, in the embodiment of FIG. 1, each of the second contact pads 112 is connected in series with a third contact pad 120, and further connected to the die pad 104. In other words, each of the second contact pads 112 and each of the third contact pads 120 connected in series extend from the die pad 104. The third contact pads 120 are disposed in the encapsulating material 102 and located between the die pad 104 and the second contact pads 112. The third contact pads 120 are electrically coupled to the chip 108, for example, via the bonding wire 124. Each of the third contact pads 120 has at least two third contacts pad extensions 122 corresponding to one of the die pad extensions 106 and one of the second contact pad extensions 114 respectively. The bottom surfaces 120A, 122A of the third contact pads 120 and the third contact pad extensions 122 are exposed on the package bottom surface 102A. The thickness of the third contact pad extensions 122 relative to the package bottom surface 102A is smaller than the thickness of the third contact pads 120 relative to the package bottom surface 102A.

Figure 1A:
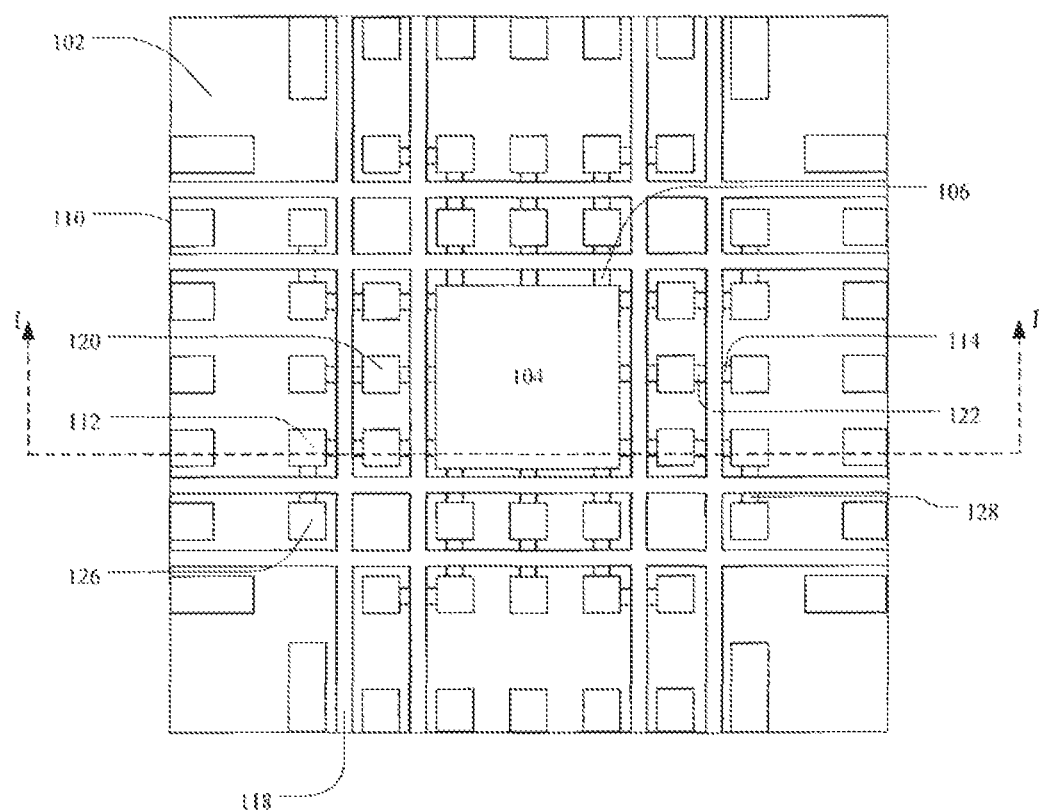

Please refer to FIG. 1A, which is the schematic diagram illustrating the bottom view of a flat no-lead package, according to the embodiment shown in FIG. 1, wherein FIG. 1 is the cross-section along line I-I of FIG. 1A. At least one of the second contact pads 112 can be further connected in series with a fourth contact pad 126. The fourth contact pad 126 is disposed in the encapsulating material 102 and located between the die pad 104 and the first contact pads 110, and electrically coupled to the chip 108. The fourth contact pad 126 has a fourth contact pad extension 128 corresponding to the second contact pads 112 connected therewith in series. In the embodiment, the fourth contact pad extension 128 is perpendicular to the second contact pad extension 114 of the corresponding second contact pad 112, but the present invention is not limited to this. The bottom surfaces of the fourth contact pad 126 and the fourth contact pad extension 128 are exposed on the package bottom surface 102A.

In some embodiments of the present invention, the flat no-lead package 100 further comprises at least one trench 118 between the die pad 104 and the second contact pads 112. As shown in FIG. 1, the trenches 118 are formed between the die pad 104 and the third contact pads 120, and between the second contact pads 112 and the third contact pads 120, respectively. The trenches 118 expose the end of each of the die pad extensions 106 away from the die pad 104 and the end of each of the second contact pad extensions 114 near the die pad 104. The trenches 118 also expose the end of each of the third contact pad extensions 122 away from the third contact pad 120. Similarly, the trenches 118 can also be formed between the second contact pads 112 and the fourth contact pads 126, and expose the end of each of the fourth contact pad extensions 128 away from the fourth contact pad 126. The trenches 118 are formed by a method selected from a group consisting of sawing, etching, punching and a combination thereof, by which a part of the encapsulating material 102 and the connection portions between the die pad 104, the second contact pads 112 and the third contact pads 120 are removed. Ones skilled in the art should know that an insulation material (not shown in the figure) can be filled in the trenches 118.

As mentioned above, the flat no-lead package of the present invention can have increased number of contact pads without increasing the footprint area of the package. That is to say, between the first contact pads 110 near the edges of the encapsulating material 102 and the die pad 104, there can be a plurality of the second contact pads 112, the third contact pads 120 and the fourth contact pads 126 disposed therein so that the number of the contact pads is increased but the package footprint area is not enlarged.

Figure 2:
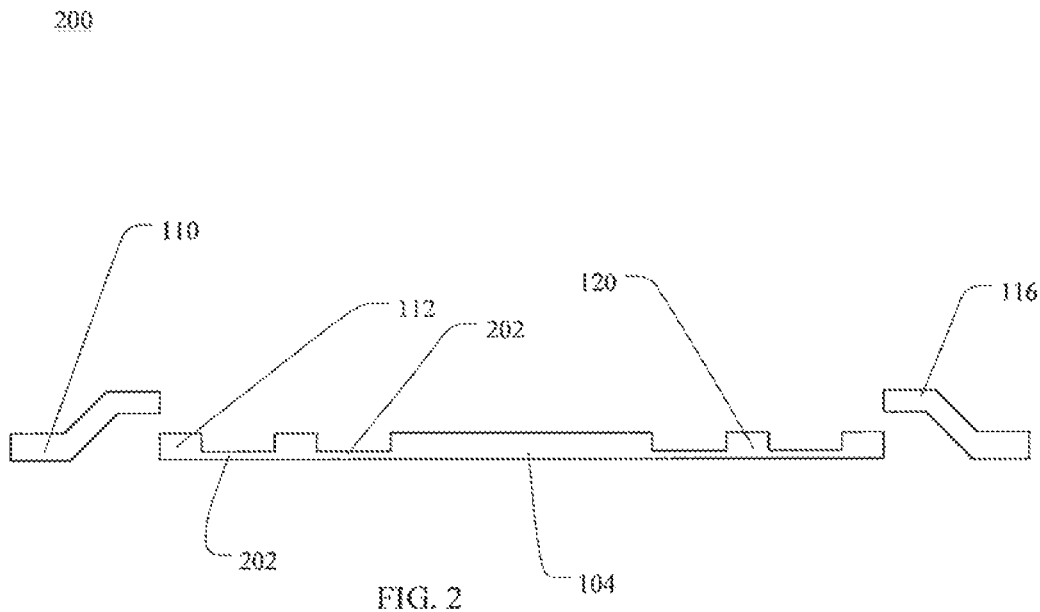
FIG. 2 to FIG. 6 are schematic cross-sectional diagrams of each step of the method for manufacturing a flat no-lead package, according to another embodiment of the present invention.
Figure 2A:
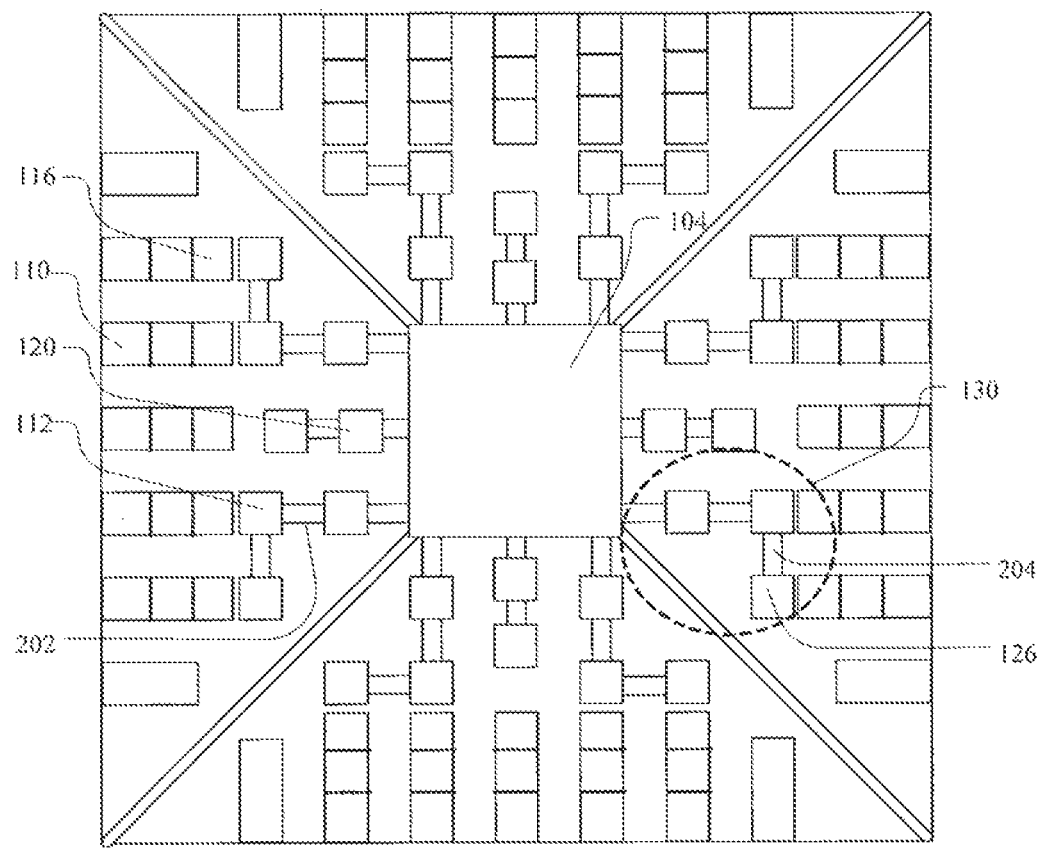
FIG. 2A is a schematic diagram illustrating the top view corresponding to the step of the method for manufacturing a flat no-lead package in FIG. 2, according to another embodiment of the present invention.

Please refer to FIG. 2 to FIG. 6, which are schematic cross-sectional diagrams of each step of the method for manufacturing a flat no-lead package, according to another embodiment of the present invention. Please refer to FIG. 2 and FIG. 2A at the same time. According to another embodiment of the present invention, a method for manufacturing, a flat no-lead package comprises first providing as lead frame 200, where the lead frame 200 comprises a die pad 104, a plurality of first contact pads 110, a plurality of second contact pads 112, and a plurality of third contact pads 120. The first contact pads 110 are disposed around the die pad 104, and at least one of the first contact pads 110 has a first contact pad extension 116 extending to the die pad 104 and bending upward as shown in FIG. 2. The second contact pads 112 and the third contact pads 120 are disposed between the die pad 104 and the first contact pads 110, wherein each of the second contact pads 112 and each of the third contact pads 120 are connected to each other and to one of the sides of the die pad 104 through a first connection portion 202 respectively.

The manner of the contact pads extending from the die pad 104 in the lead frame 200 is not limited to that mentioned above. Preferably, the contact pads extending from the die pad 104 are arranged in staggered manner with each other. For the design of the lead frame 200, from the edges the die pad 104 can extend multiple contact pad strings each with two or more than two of the contact pads connected in series. In addition, as shown in region 130 of FIG. 2A, the lead frame 200 can further comprise at least one fourth contact pad 126, which is located between the die pad 104 and the first contact pads 110, wherein the at least one fourth contact pad 126 is connected to one of the second contact pads 112 through a second connection portion 204. It is worth noting that, whether the connection portions between the contact pads connected in series or the first connection portions 202 between the contact pads and the die pad 104, one feature of the present invention is that, in the manufacturing process of the lead frame 200, a half-etching process is preferably performed on the connection portions 202, 204 to etch toward the bottom surface of the package so that the thicknesses of the connection portions 202, 204 between the die pad 104 and the contact pads and between the contact pads are smaller than the thickness of the contact pads. In some embodiments of the present invention, preferably, the distances between at least two of the second contact pads 112 adjacent to each other or at least two of the third contact pads 120 adjacent to each other and the die pad 104 are different, that is, any two of the second contact pads 112 adjacent to each other or any two of the third contact pads 120 adjacent to each other are staggered with each other.

Figure 3:
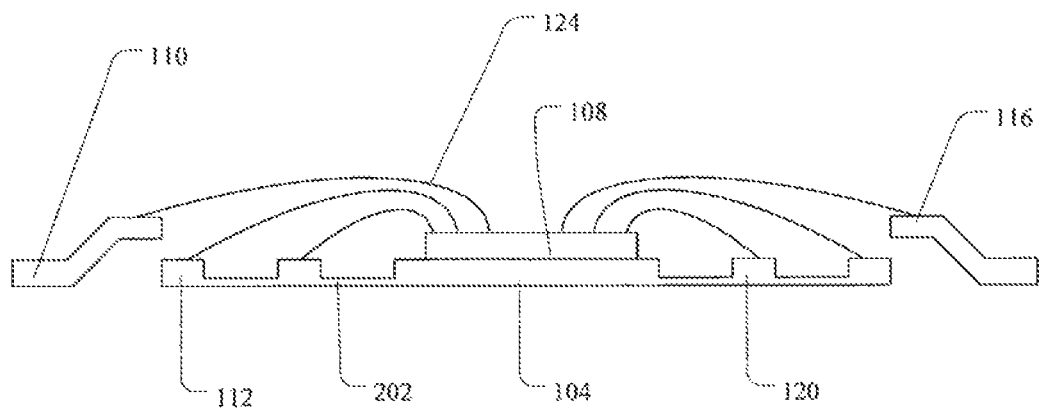

Referring to FIG. 3, a chip 108 is then mounted on the die pad 104, and attached to the die pad 104, for example, via a die attachment epoxy or a die attachment film (not shown in the figure). The adhesive materials can be electrically conductive to ground the chip, or thermally conductive for the chip 108 to dissipate heat via the die pad 104. The wire bonding process is then performed to electrically couple the chip 108 to the first contact pads 110, the second contact pads 112, and the third contact pads 120 respectively via the bonding wires 124, wherein the bonding wires 124 are preferably connected to the first contact pad extensions 116 of the first contact pads 110. Furthermore, although it is not shown in the figure, the chip 108 can also be electrically coupled to the fourth contact pads 126 via the bonding wires 124.

Figure 4:
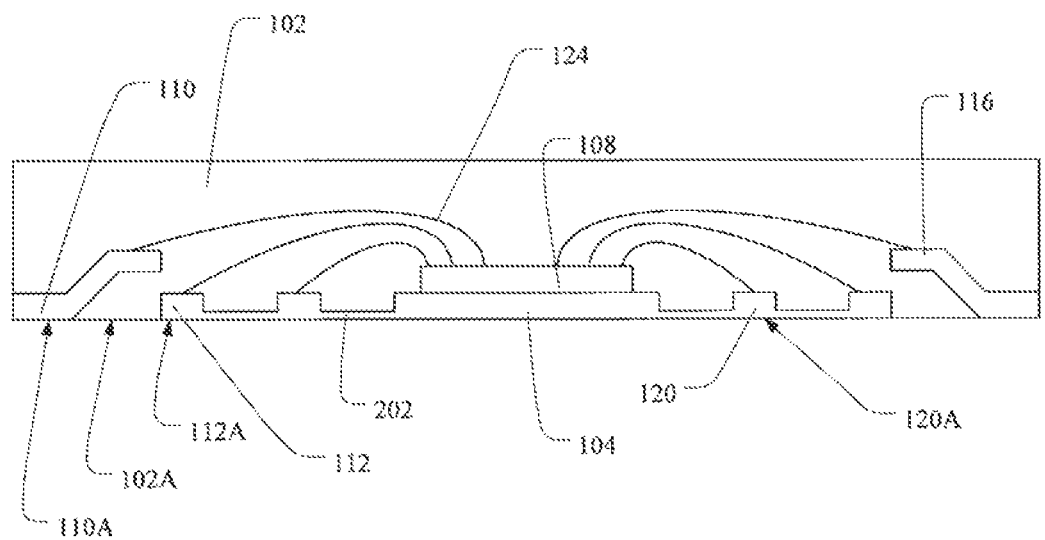

Please refer to FIG. 4. An encapsulating material 102 is then formed to cover the lead frame 200, the chip 108 and the bonding wires 124, wherein the package bottom surface 102A of the encapsulating material 102 exposes the bottom surfaces 110A, 112A, and 120A of the first contact pads 110, the second contact pads 112 and the third contact pads 120. Furthermore, preferably, the encapsulating material 102 also exposes the bottom surface of the die pad 104 in order to dissipate heat generated from the chip 108. As shown in FIG. 4, the package bottom surface 102A of the encapsulating material 102 also exposes the bottom surface of the first connection portions 202 between the die pad 104, the second contact pads 112 and the third contact pads 120. Similarly, though it is not shown in the figure, the bottom surface 102A of the encapsulating material 102 also exposes the bottom surface of the second connection portions 204 connecting the second contact pads 112 and the fourth contact pads 126, and the bottom surface of the fourth contact pads 126.

Figure 5:
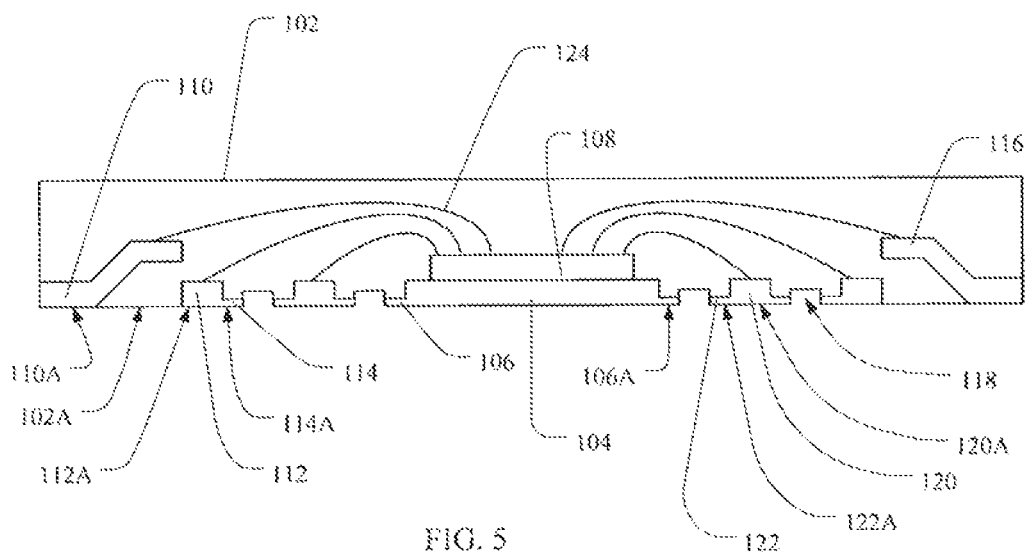

Please refer to FIG. 5. The first connection portions (202 in FIG. 4) and the second connection portions (204 in FIG. 2A) are then partially removed to separate the second contact pads 112, the third contact pads 120, the fourth contact pads 126 and the die pad 104 from one another such that the die pad 104 has a plurality of die pad extensions 106 formed on the edges, each of the second contact pads 112 has a second contact pad extension 114 corresponding to one of the die pad extensions 106 respectively, each of the third contact pads 120 has at least two third contact pad extensions 122 corresponding to one of the die pad extensions 106 and one of the second contact pad extensions 114 respectively, and the fourth contact pad 126 has one fourth contact pad extension (128 in FIG. 1A) corresponding to the second contact pad 112. Though it is not shown in FIG. 5, in the embodiment, the fourth contact pad extension 128 is perpendicular to the second contact pad extension 114 of the corresponding second contact pad 112, but the present invention is not limited to this. The bottom surfaces 114A, 122A of the second contact pad extensions 114 and the third contact pad extensions 122 are exposed on the package bottom surface 102A. The bottom surface of the fourth contact pad extensions 128 are also exposed on the package bottom surface 102A. The thicknesses of the die pad extensions 106 and the second contact pad extensions 114 relative to the package bottom surface 102A are smaller than the thicknesses of the die pad 104 and the second contact pads 112 relative to the package bottom surface 102A, respectively. The thickness of the third contact pad extensions 122 relative to the package bottom surface 102A is smaller than the thickness of the third contact pads 120 relative to the package bottom surface 102A. The thickness of the fourth contact pad extensions 128 relative to the package bottom surface 102A is smaller than the thickness of the fourth contact pads 126 relative to the package bottom surface 102A.

The step of partially removing the connection portions 202, 204 can be performed by a method selected from a group consisting of sawing, etching, punching and a combination thereof. As mentioned above, the design of the connection portions 202, 204 with smaller thicknesses is advantageous to the step of partially removing the connection portions as it prevents the depth of the partial removal from being too large, especially when sawing or punching method is used for the step of partial removal, which can prevent the bonding wires and other contact pads from being damaged, thus increasing the production yields. The aim of the partial removal process is just to separate the second contact pads 112, the third contact pads 120, the fourth contact pads 126 and the die pad 104 from one another. So the partial removal can end as long as the connection portions 202, 204 are disconnected. The die pad extensions 106, the second contact pad extensions 114, the third contact pad extensions 122 and the fourth contact extensions 128 are the remnants after the partial removal step. However, ones skilled in the art should know that, in some ideal process conditions, the partial removal process may result in no remnant remaining, or only parts of the regions in the contact pads 112, 120, 126 and the die pad 104 having remnants, or only burrs remaining. These conditions should all be included in the protected range of the present invention as even only burrs remaining should also be considered as a type of the extensions.

As mentioned above, in the step of partially removing the connection portions 202, 204, a part of the encapsulating material 102 will also be removed. The aim of the partial removal process is to separate the second contact pads 112, the third contact pads 120, the fourth contact pads 126 and the die pad 104, so the depth of removal just needs to be greater than the thickness of the connection portions 202, 204, but needs not be greater than the thickness of the second contact pads 112, the third contact pads 120, and/or the fourth contact pads 126.

After the partial removal process, trenches 118 are formed between the die pad 104, the second contact pads 112, the third contact pads 120 and the fourth contact pads 126. As shown in FIG. 5, the trenches 118 are formed between the die pad 104 and the third contact pads 120, and between the second contact pads 112 and the third contact pads 120. The trenches 118 expose the end of each of the die pad extensions 106 away from the die pad 104 and the end of each of the second contact pad extensions 114 near the die pad 104. The trenches 118 also expose the end of each of the third contact pad extensions 122 away from the third contact pad 120. Though it is not shown in the figure, the trenches 118 also expose the end of each of the fourth contact pad extensions 128 away front the fourth contact pad 126.

Figure 6:
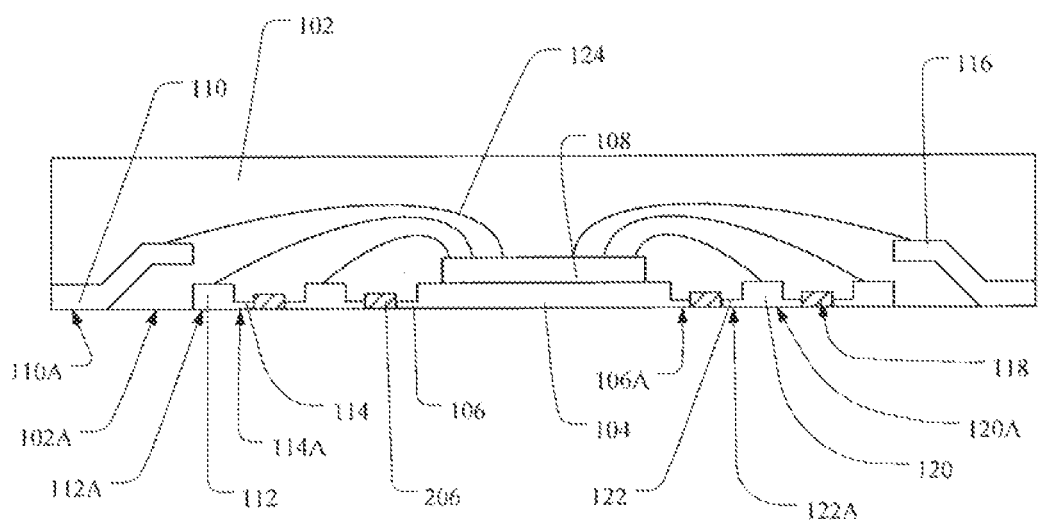

Please refer to FIG. 6. In order to enhance the electrical isolation between the die pad 104, the second contact pads 112, the third contact pads 120, and the fourth contact 126, and to protect the exposed regions of the die pad extensions 106, the second contact pad extensions 114, the third contact pad extensions 122, and the fourth contact pad extensions 128, or to make the appearance smooth, an insulation material 206 can be optionally filled in the trenches 118. However, the ones skilled in the art should know that this step is optional and can be ignored depending on the practical conditions and thus the protection of the present invention shall not be influenced.

In summary, according to the method for manufacturing the flat no-lead package of the present invention, the number of contact pads can be increased without enlarging the footprint area of the package. That is to say, between the first contact pads 110 near the edges of the encapsulating material 102 and the die pad 104, there can be a plurality of the second contact pads 112, the third contact pads 120, and the fourth contact pads 126 disposed therein so that the number of the contact pads is increased but the package footprint area is not enlarged. By means of the design of reducing the thickness of the connection portions, and the design of the first contact pad extension bending upwards, the production yield can be ensured, and the quality of products can be enhanced.

With the example and explanations above, the features and spirits of the invention will be hopefully well described. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A flat no-lead package comprising:
    an encapsulating material, having a package bottom surface;
    a die pad, disposed in the encapsulating material and adjacent to the package bottom surface, wherein a plurality of die pad extensions extend from edges of the die pad, and a bottom surface of one end of each of the die pad extensions which is away from the die pad is exposed on the package bottom surface;
    a chip, disposed in the encapsulating material and mounted on the die pad;
    a plurality of first contact pads, disposed in the encapsulating material and near edges of the encapsulating material and being electrically coupled to the chip, wherein a bottom surface of the first contact pads is exposed on the package bottom surface; and
    a plurality of second contact pads, disposed in the encapsulating material and located between the die pad and the first contact pads and being electrically coupled to the chip, wherein each of the second contact pads has a second contact pad extension corresponding to one of the die pad extensions respectively, bottom surfaces of the second contact pads and the second contact pad extensions are exposed on the package bottom surface;

wherein at least one of the first contact pads has a first contact pad extension extending to the die pad and bending away from the package bottom surface, where the at least one of the first contact pads is electrically coupled to the chip through the first contact pad extension.

2. The flat no-lead package of claim 1, wherein thicknesses of the die pad extensions and the second contact pad extensions relative to the package bottom surface are smaller than thicknesses of the die pad and the second contact pads relative to the package bottom surface respectively.

3. The flat no-lead package of claim 1, further comprising at least one trench between the die pad and the second contact pads, the at least one trench exposing the end of each of the die pad extensions away from the die pad and one end of each of the second contact pad extensions near the die pad.

4. The flat no-lead package of claim 3, wherein the at least one trench is formed by a method selected from a group consisting of sawing, etching, punching and a combination thereof.

5. The flat no-lead package of claim 3, further comprising an insulation material filled in the at least one trench.

6. The flat no-lead package of claim 1, wherein a thickness of at least a part of an edge of each of the second contact pads relative to the package bottom surface is smaller than a thickness of the second contact pads relative to the package bottom surface.

7. The flat no-lead package of claim 1, further comprising a plurality of third contact pads disposed in the encapsulating material and located between the die pad and the second contact pads and being electrically coupled to the chip, wherein each of the third contact pads has at least two third contact pad extensions corresponding to one of the die pad extensions and one of the second contact pad extensions respectively, bottom surfaces of the third contact pads and the third contact pad extensions are exposed on the package bottom surface.

8. The flat no-lead package of claim 7, wherein a thickness of the third contact pad extensions relative to the package bottom surface is smaller than a thickness of the third contact pads relative to the package bottom surface.

9. The flat no-lead package of claim 1, wherein distances between the die pad and at least two of the second contact pads adjacent to each other and each with the second contact pad extension corresponding to one of the die pad extensions respectively are different.

10. The flat no-lead package of claim 9, wherein any two of the second contact pads adjacent to each other and each with the second contact pad extension corresponding to one of the die pad extensions respectively are staggered with each other.

11. The flat no-lead package of claim 1, further comprising at least one fourth contact pad disposed in the encapsulating material and located between the die pad and the first contact pads and being electrically coupled to the chip, wherein the at least one fourth contact pad has one fourth contact pad extension corresponding to one of the second contact pads, bottom surfaces of the at least one fourth contact pad and the fourth contact pad extension are exposed on the package bottom surface.

12. A method for manufacturing a flat no-lead package, comprising:

providing a lead frame, comprising a die pad, a plurality of first contact pads and a plurality of second contact pads, the first contact pads disposed around the die pad, the second contact pads disposed between the die pad and the first contact pads, wherein each of the second contact pads is connected to a side of the die pad through a first connection portion respectively;

mounting a chip on the die pad, the chip electrically coupled to the first contact pads and the second contact pads respectively;

forming an encapsulating material for covering the lead frame and the chip, wherein the encapsulating material exposes bottom surfaces of the first contact pads and the second contact pads; and partially removing the first connection portions for separating the second contact pads and the die pad such that the die pad has a plurality of die pad extensions and each of the second contact pads has a second contact pad extension corresponding to one of the die pad extensions respectively, the encapsulating material exposing a bottom surface of the second contact pad extensions;

wherein at least one of the first contact pads has a first contact pad extension extending to the die pad and bending away from a bottom surface of the encapsulating material, where the at least one of the first contact pads is electrically coupled to the chip through the first contact pad extension.

13. The method for manufacturing a flat no-lead package of claim 12, wherein the bottom surfaces of the second contact pad extensions and the second contact pads and a bottom surface of the die pad extensions are a common surface, and thicknesses of the die pad extensions and the second contact pad extensions are smaller than a thickness of the second contact pads.

14. The method for manufacturing a flat no-lead package of claim 12, wherein the step of partially removing the first connection portions is performed by a method selected from a group consisting of sawing, etching, punching and a combination thereof.

15. The method for manufacturing a flat no-lead package of claim 12, wherein the lead frame further comprises a plurality of third contact pads located between the die pad and the second contact pads, wherein each of the third contact pads is connected to one of the second contact pads and the side of the die pad respectively through one of the first connection portions, after the step of partially removing the first connection portions, the third contact pads are separated from the second contact pads and the die pad so that each of the third contact pads has at least two third contact pad extensions corresponding to one of the die pad extensions and one of the second contact pad extensions respectively, the third contact pads are electrically coupled to the chip, and the encapsulating material exposes bottom surfaces of the third contact pads and the third contact pad extensions.

16. The method for manufacturing a flat no-lead package of claim 15, wherein a thickness of the third contact pad extensions relative to a bottom surface of the encapsulating material is smaller than a thickness of the third contact pads relative to the bottom surface of the encapsulating material.

17. The method for manufacturing a flat no-lead package of claim 12, wherein distances between the die pad and at least two of the second contact pads adjacent to each other and each connected to the side of the die pad respectively with one of the first connection portions are different.

18. The method for manufacturing a flat no-lead package of claim 17, wherein any two of the second contact pads adjacent to each other and each connected to the side of the die pad respectively with one of the first connection portions are staggered with each other.

19. The method for manufacturing a flat no-lead package of claim 12, wherein the step of partially removing the first connection portions simultaneously removes a part of the encapsulating material, where a depth of the encapsulating material being removed is smaller than or equal to a thickness of the second contact pads.

20. The method for manufacturing a flat no-lead package of claim 12, wherein the lead frame further comprises at least one fourth contact pad located between the die pad and the first contact pads, wherein the at least one fourth contact pad is connected to one of the second contact pads through a second connection portion, where during the step of partially removing the first connection portions, the second connection portion is partially removed simultaneously for separating the at least one fourth contact pad from one of the second contact pads, and the at least one fourth contact pad has a fourth contact pad extension corresponding to one of the second contact pads and is electrically coupled to the chip, and the encapsulating material exposes bottom surfaces of the at least one fourth contact pad and the fourth contact pad extension.

* * * * *